United States Patent [19]

Kasamatsu

[11] Patent Number: 5,852,770
[45] Date of Patent: Dec. 22, 1998

[54] TRANSMISSION POWER CONTROL DEVICE FOR A PORTABLE TERMINAL

[75] Inventor: Hideki Kasamatsu, Hirakata, Japan

[73] Assignee: Sanyo Electric Co., Ltd., Moriguchi, Japan

[21] Appl. No.: 530,415

[22] Filed: Sep. 19, 1995

[51] Int. Cl.[6] .................................................. H04B 1/04
[52] U.S. Cl. ........................ 455/126; 455/127; 330/129
[58] Field of Search .................................. 455/126, 115, 455/116, 127; 330/140, 141, 129, 85; 375/297, 312

[56] References Cited

U.S. PATENT DOCUMENTS

| | | | |
|---|---|---|---|
| 5,128,629 | 7/1992 | Trinh | 330/129 |
| 5,193,224 | 3/1993 | McNicol et al. | 455/126 |
| 5,307,512 | 4/1994 | Mitzlaff | 455/126 |
| 5,313,658 | 5/1994 | Nakamura | 455/69 |
| 5,371,473 | 12/1994 | Trinh et al. | 330/129 |
| 5,376,895 | 12/1994 | Aihara | 330/129 |

Primary Examiner—Wellington Chin
Assistant Examiner—Lee Nguyen
Attorney, Agent, or Firm—Armstrong, Westerman, Hattori, McLeland & Naughton

[57] ABSTRACT

A device for controlling the signal output of transmission equipment, which includes a power amplifier circuit for amplifying an inputted transmission signal by an amplification factor decided by an applied first control voltage, a coupler for monitoring the transmission signal amplified by the power amplifier circuit, a variable gain amplifier for amplifying the monitoring signal by an amplification factor decided by an applied second control voltage, a detection circuit for detecting a output signal of the variable gain amplifier and generating a detection voltage, a differential amplifier for comparing the detection voltage and a supplied reference voltage and amplifying the difference to generate a first control signal, and a control circuit for generating the reference voltage and the second control voltage, so that when the radio output is controlled, the gain of the variable gain amplifier is adjusted by the control circuit so that the level of the monitoring signal falls within the range for which detection by the detection means is possible.

18 Claims, 9 Drawing Sheets

TRANSMISSION POWER CONTROL DEVICE FOR A PORTABLE TERMINAL

BACKGROUND OF THE INVENTION

1. Field of the Invention

The present invention relates to a transmission power control device for controlling the transmission output of a portable terminal.

2. Prior Art

Power control circuits used for output control of mobile communication equipment, such as portable phones in particular, are installed, for example, at the final stage of the transmission means, and are used to control gradual changes in the output power level so as to automatically output a set transmission power level and ensure the stability of such output.

FIG. 1 shows a construction of a conventional transmission power control circuit used by an analog portable telephone system.

A power amplifier circuit 201, which is used as the transmission signal amplification means, changes the amplification factor in accordance with the control voltage $V_{CONT}$ applied to its voltage control terminal.

The transmission signal sent from the out put circuit of the communication equipment (not illustrated) is amplified by at a given amplification factor by the power amplifier circuit 201, with this output passing through a coupler 202 of a degree of coupling of around 10–20 dB, so that the output is constantly monitored.

When an RF signal passes through, the coupler 202 takes the electric power of the transmission signal according to said degree of coupling from the coupling output terminal 202a as the monitoring output and inputs it into a detection circuit 203.

The detection circuit 203 detects the envelope curve of the monitoring output and converts it into a DC detection voltage $V_d$.

The detection voltage $V_d$ is then inputted into an inverse input terminal 204a of a differential amplifier circuit 204, while a reference voltage $V_{Ref}$ generated by a control circuit 205 is applied to a non-inverse input terminal 204b.

The differential amplifier circuit 204 compares the applied voltages $V_{Ref}$ and $V_d$, before outputting an output voltage according to the difference between these applied voltages as the control voltage $V_{CONT}$.

This control voltage $V_{CONT}$ is then fed back into the voltage control terminal of the power amplifier circuit 201, and so increases or reduces the amplification factor of the power amplifier circuit 201.

Accordingly, by controlling the reference voltage $V_{Ref}$ using the control circuit 205, it is possible to obtain a transmission output in accordance with a given value of the reference voltage $V_{Ref}$, so that once the reference voltage $V_{Ref}$ is fixed, the transmission output will always be at a fixed level due to level stabilization by the feedback loop.

However, for transmission power control circuits of the construction described above, the range of power control is set according to the dynamic range of the detection circuit 203 and the range of the reference voltage $V_{Ref}$ generated by the control circuit 205, so that there has been the problem of such circuits not being able to cope when the dynamic range of the power control becomes wide.

More specifically, since the detection circuit 203 is usually composed of a diode 203a for rectifying the AC signal and a DC detector 203b, made up of a resistor and a condenser, for monitoring the envelope curve of the coupler output signal, there is a first problem of the existence of a "dead zone" wherein the circuit can no longer function properly, this occurring when, supposing diode 203a exhibits normal characteristics, the inputted forward voltage drops to around 0.1V. As a result, a dynamic range of 30 to 40 dB at most can only be achieved for the detection circuit 203, with this limit on the range of possible detection resulting in a limit in the power control range.

A second problem is that, even if it is supposed that detection circuit 203 can detect over a wide dynamic range, since battery-powered communication equipment, such as a portable telephone unit, is powered by low voltages such as 6V so as to reduce the size and weight of the equipment, there are limits on the ranges of the reference voltage $V_{Ref}$ and the control voltage $V_{CONT}$, which therefore restricts the control range of the power control.

In particular, for digital cellular portable telephone systems using CDMA (Code Division Multiple Access) methods (IS-95 standard), it is necessary to have power control in 1 dB steps over a dynamic range of at least 64 dB, so that for a conventional transmission power control circuit constructed as shown in FIG. 1, the aforementioned problems of the dead zone of the detection circuit and the restriction of the range of voltage due to the batteries used have led to the dynamic range being insufficient, so that such conventional transmission power control circuits have not been able to fulfill the requirements of the stated standard.

Furthermore, for the circuit construction of FIG. 1, other problems arise when the circuit is sent a burst signal, such as those on RCR-STD27C, IS-54 standard for TDMA (Time Division Multiple Access) methods which are used by both U.S. and Japanese cellular phones.

More specifically, for transmission under burst methods, the monitoring output from the coupler 202 fluctuates greatly between when the burst is ON and when the burst is OFF, which causes the detection voltage $V_d$ to correspondingly fluctuate greatly, which prevents the system from being able to execute power control correctly.

SUMMARY OF THE INVENTION

In view of the problems experienced with the prior art techniques described above, it is a primary object of the present invention to provide a transmission power control device for a portable terminal which can execute precise power control over a wide dynamic range and which is further adapted to transmission using burst techniques.

In order to achieve the stated object, the transmission power control device for a portable terminal comprises a transmission signal amplification unit for amplifying an inputted transmission signal by an amplification factor decided by an applied first control signal; a monitoring unit for monitoring the transmission signal amplified by the transmission signal amplification unit; a monitoring signal amplification unit for amplifying an output of the monitoring unit by an amplification factor decided by an applied second control signal; a detection unit for detecting an output signal from the monitoring signal amplification unit; a differential amplification unit for comparing a signal outputted by the detection unit and a supplied reference signal and amplifying a difference between the two signals so as to generate the first control signal; and a control unit for generating the second control signal and the reference signal.

Furthermore, when the transmission signal is to be transmitted in burst format, the transmission power control device may further comprise a sample/hold unit, disposed between the detection unit and the differential amplification unit, which, according to an indication from the control unit, samples or holds the signal outputted by the detection unit, and then supplies the sampled or held signal outputted by the detection unit to the differential amplification unit.

BRIEF DESCRIPTION OF THE DRAWINGS

These and other objects, advantages and features of the invention will become apparent from the following description taken in conjunction with the accompanying drawings which illustrate a specific embodiment of the invention. In the drawings.

DESCRIPTION OF THE PREFERRED EMBODIMENTS

Figure 1:
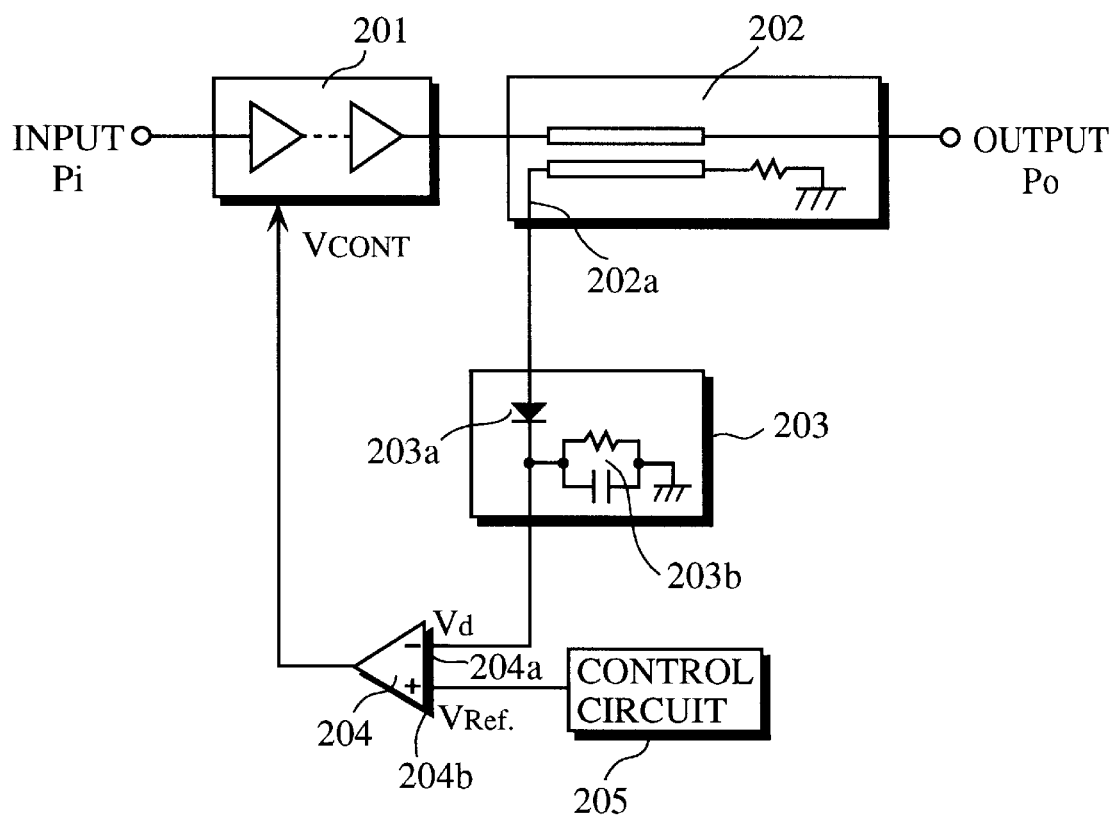
FIG. 1 shows a construction of an example of a transmission power control circuit for a mobile terminal according to the prior art.
Figure 2:
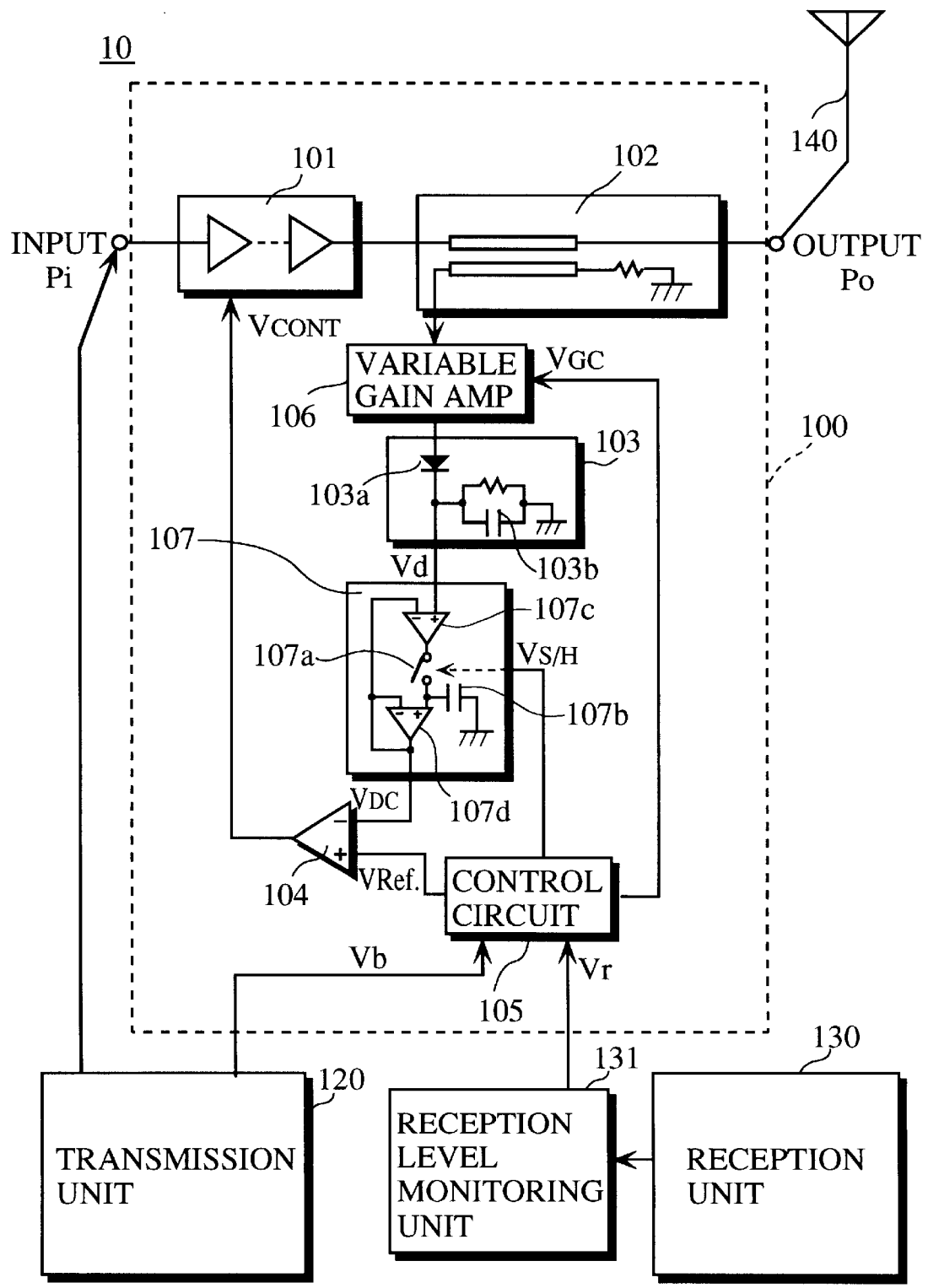
FIG. 2 shows a construction of a mobile terminal adapted to the transmission power control circuit to which the first embodiment of the present invention relates.

The following is an explanation of the various embodiments of the present invention.
First Embodiment FIG. 2 shows the overall construction of a radio communication device 10 which uses the transmission power control circuit 100 to which the first embodiment of the present invention relates.

In this figure, the radio communication device 10 can be seen to be composed of a transmission unit 120 for generating an RF transmission signal, the transmission power control circuit 100 for controlling the output of the RF transmission signal generated by the transmission unit 120, a reception unit 130 for receiving a signal from a cell station, a reception level monitoring unit 131 for monitoring a reception level at the reception unit 130 and an antenna 140.

The transmission power control circuit 100 is made up of a power amplifier circuit 101, a coupler 102, a detection circuit 103, a differential amplification circuit 104, a control circuit 105, a variable gain amplifier 106 and a sample/hold circuit 107.

The power amplifier circuit 101 performs the power amplification of the RF transmission signal generated by the transmission unit 120, varying its amplification factor in accordance with the control voltage $V_{CONT}$.

In the internal circuit of the power amplifier circuit 101, an amplification element (such as GaAsFET or MOSFET) terminal of the differential amplification circuit 107d being connected to the inverse input terminals of each of the differential amplification circuits 107c and 107d, and the non-inverse input terminal of the differential amplification circuit 107d being connected to earth via the condenser 107b.

When transmitting according to burst methods, the control circuit 105 is sent a control signal $V_b$ from the transmission unit 120 relating to the ON/OFF state of the burst signal. When a burst ON signal is received, the control signal $V_{S/H}$ is set at its H level, while when a burst OFF signal is received, the control signal $V_{S/H}$ is set at its L level.

This kind of control signal $V_b$ can be obtained, for example, from a burst signal generation circuit provided inside the transmission unit 120.

Figure 3:
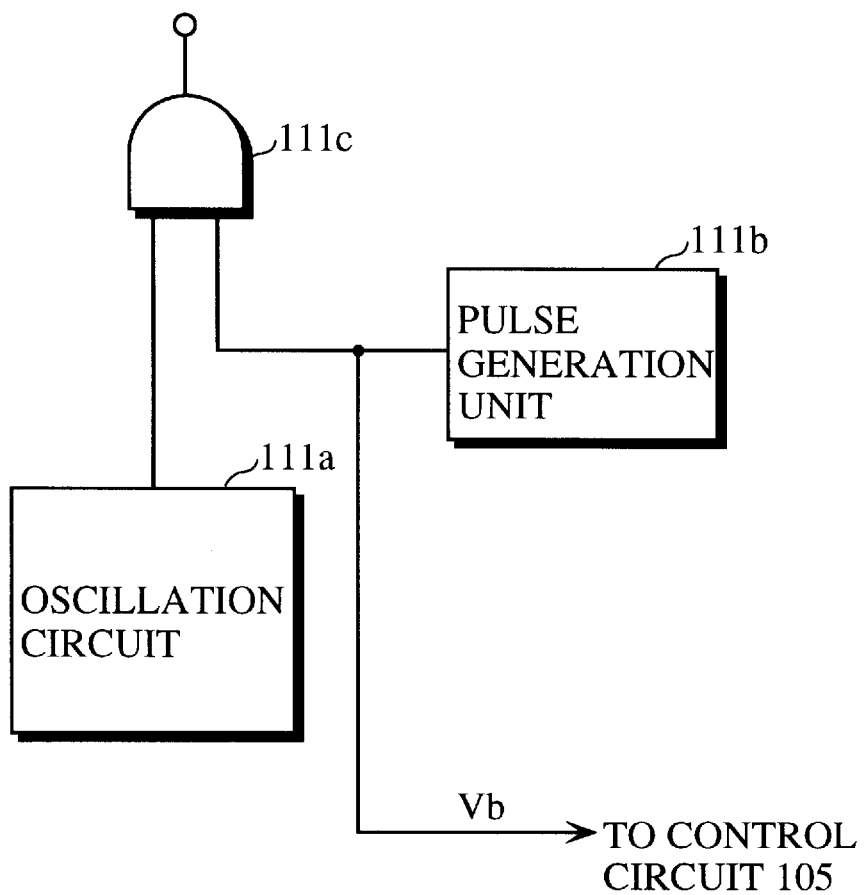
FIG. 3 shows a example construction of the burst signal generation circuit in the transmission unit of the above mobile terminal.

FIG. 3 shows a example construction of such a burst signal generation circuit. As shown in this figure, the burst signal generation circuit 111 is constructed so that the frequency output from the transmission circuit 111a and the pulse output from the pulse generation unit 111b are inputted into the AND gate circuit 111c, so that a signal is transmitted only when the pulse output is at H level (burst ON).

The pulse output from this pulse generation unit 111b is then taken as it is by the control circuit 105 as the control signal $V_b$, with it being possible for the control circuit 105 to be constructed so that the control signal $V_{S/H}$ which can change the amplification factor in accordance with the control voltage $V_{CONT}$ applied and a variable attenuator, or the like, which can similarly change its attenuation factor, are connected in series, and are constructed so that, for example, if the control voltage $V_{CONT}$ is 3.5V, the amplification factor for the RF transmission signal can be increased to as high as +30 dB, while if the control voltage $V_{CONT}$ is 0.5V, the attenuation factor for the RF transmission signal can be reduced to as low as −60 dB.

The coupler 102 is a directional coupler for monitoring the level of the RF transmission signal amplified by the power amplifier circuit 101.

The variable gain amplifier 106 changes its gain in accordance with the control voltage $V_{GC}$ applied by the control circuit 105.

The detection circuit 103 generates the detection voltage $V_d$ by detecting the monitoring output from the coupler 102.

The sample/hold circuit 107 outputs the detection voltage $V_d$ to the differential amplification circuit 104 which follows in the circuit, sampling or holding depending on the transmission condition of the transmission signal. It is composed of an internal switch 107a, a condenser 107b, and differential amplification circuits 107c and 107d.

More specifically, the switch 107a is provided between the output terminal of the differential amplification circuit 107c and the non-inverse input terminal of the differential amplification circuit 107d, with the output is set at H level when the control signal $V_b$ is at H level and the control signal $V_{S/H}$ is set at L level when the control signal $V_b$ is at L level.

The operation of the sample/hold circuit 107 is controlled by means of the control signal $V_{S/H}$ generated in this way, so that when the control signal $V_{S/H}$ is at H level, the internal switch 107a is set at ON.

At such a time, since the output terminal of the differential amplification circuit 107d is connected to the inverse input terminals of each of the differential amplification circuits 107c and 107d, the potential at each input terminal and output terminal becomes equal, so that the detection voltage $V_d$ passes through as it is and so becomes the sample voltage $V_{DC}$ (sampling mode).

On the other hand, when the control signal $V_{S/H}$ is at L level, the internal switch 107a is set at OFF, so that only the potential at the condenser 107b is applied to the non-inverse input terminal of the differential amplification circuit 107d. Since the internal resistance of the differential amplification circuit 107d is high, the final potential of the detection voltage $V_d$ in sampling mode continues to be held by the condenser 107b and, since the output terminal of the differential amplification circuit 107d is connected to the inverse input terminal of the differential amplification circuit 107d, the potential at each input terminal and the output terminal become equal, so that the detection voltage $V_d$ in sampling mode is held and is outputted as the hold voltage $V_{DC}$ (hold mode).

The sample/hold voltage $V_{DC}$ obtained from the sample/hold circuit 107 is then applied to the inverse input terminal of the differential amplification circuit 104, with a reference voltage $V_{Ref.}$ generated by the control circuit 105 being applied to the non-inverse input terminal.

The differential amplification circuit 104 then generates the control voltage $V_{CONT}$ based on the sample/hold voltage $V_{DC}$ and the reference voltage $V_{Ref.}$ and supplies the control voltage $V_{CONT}$ to the power amplifier circuit 101.

As described above, the control circuit 105 generates the reference voltage $V_{Ref.}$ inputted into the differential amplification circuit 104 in order to control the transmission output, a control voltage $V_{GC}$ for controlling the gain of the variable gain amplifier 106 and the sample/hold control signal $V_{S/H}$ for controlling the sample/hold circuit 107, and in doing so controls each of the components.

The following is a detailed description of the control operation of the present embodiment.

The reception monitoring voltage $V_r$ monitored by the reception level monitoring unit 131 connected to the reception unit 130 is inputted into the control circuit 105, with the transmission output being decided by the power amplifier circuit 101 based on this reception monitoring voltage $V_r$.

That is to say, when the level of the reception monitoring voltage $V_r$ is low, it is determined that the cell station is some distance away and the transmission level is increased. On the other hand, when the level of the reception monitoring voltage $V_r$ is high, then it is determined that the cell station is nearby and the transmission level is decreased. In this way, the transmission output is set so that the transmission level which reaches the cell station is constant.

U.S. Pat. No. 5,056,109 teaches a method for monitoring the level of the reception output of the reception unit 130 and setting the level of the transmission output, so no explanation will be given herein.

Next, the control circuit 105 supplies an appropriate control voltage $V_{GC}$ to the variable gain amplifier 106 so as to set the gain in accordance with the set transmission output, as well as supplying the reference voltage $V_{Ref.}$, set correlated to the gain of the variable gain amplifier 106, to the non-inverse input terminal of the differential amplification circuit 104.

Figure 4:
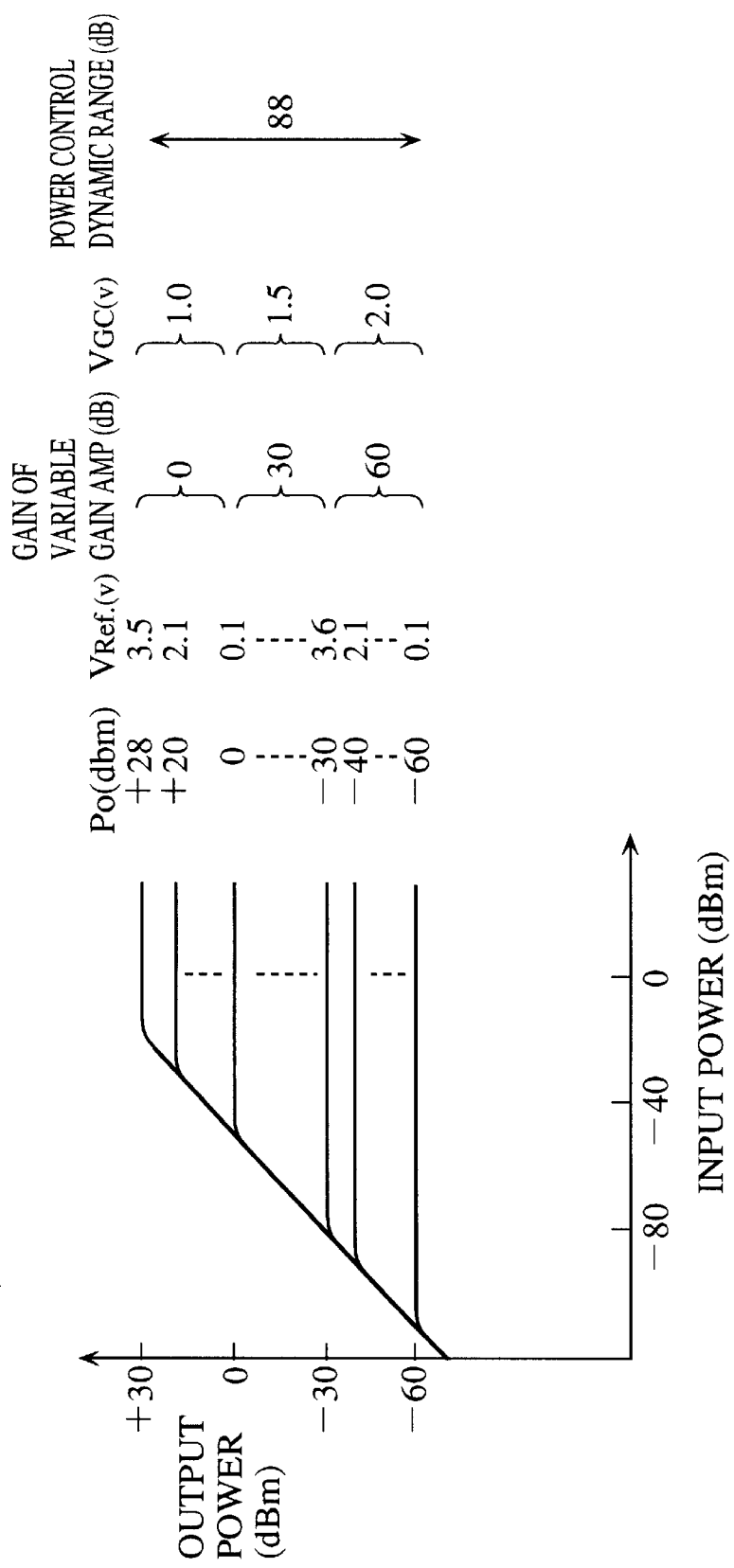
FIG. 4 shows the input/output characteristics for showing the power control characteristics in the above embodiment.

FIG. 4 is a graph showing the relationship between input power and output power for explaining the characteristics when the gain of the variable gain amplifier 106 in the transmission power control circuit 100 is changed.

As can be seen from this figure, when the necessary transmission output Po is between 0 dBm and 28 dBm, then the level of the monitoring output of the coupler 102 is sufficient for conduction by the detection diode in the detection circuit 103. The control voltage $V_{GC}$ is set at 1.0V so that the gain of the variable gain amplifier 106 becomes 0 dB, while at the same time the reference voltage $V_{Ref.}$ is set between 0.1V and 3.5V. As one example, when the necessary transmission level is 20 dBm, the reference voltage $V_{Ref.}$ is set at 2.1V.

In the same way, when the transmission output Po is between −30 dBm and 0 dBm, the control voltage $V_{GC}$ is set at 1.5V so that the gain of the variable gain amplifier 106 becomes 30 dB. At the same time, the reference voltage $V_{Ref.}$ is set between 0.1V and 3.6V so as to give the desired transmission output.

In the same way, when the transmission output Po is between −60 dBm and −30 dBm, the control voltage $V_{GC}$ is set at 2.0V so that the gain of the variable gain amplifier 106 becomes 60 dB. At the same time, the reference voltage $V_{Ref.}$ is set between 0.1V and 2.1V so as give to the desired transmission output.

By means of this construction, the operation of the variable gain amplifier 106, disposed between the output terminal of the coupler 102 and the detection circuit 103, can be set so that if the transmission output level is high and the monitoring output of the coupler 102 is high, the gain of the variable gain amplifier 106 is reduced, or if the transmission output level is low and the monitoring output of the coupler 102 is low, the gain of the variable gain amplifier 106 is increased, so that regardless of whether the monitoring level is high or low, the gain of the variable gain amplifier 106 can be controlled so that the input level into the detection circuit 103 can be set within the range which allows conduction by the detection diode (range for which detection is possible) provided in the detection circuit 103.

This detection voltage $V_d$ generated by the detection circuit 103 is set as the sample/hold voltage $V_{DC}$ via the sample/hold circuit 107 and is then supplied to the inverse input terminal of the differential amplification circuit 104.

The reference voltage $V_{Ref.}$ generated by the control circuit 105 for obtaining the desired transmission output in the method described above is applied to the non-inverse input terminal of the differential amplification circuit 104.

The differential amplification circuit 104 generates the control voltage $V_{CONT}$ based on the difference between the sample/hold voltage $V_{DC}$ and the reference voltage $V_{Ref.}$, before outputting the control voltage $V_{CONT}$ to the power amplifier circuit 101.

By feeding back the control voltage $V_{CONT}$ into the power amplifier circuit 101 in this way, the amplification factor of the power amplifier circuit 101 of the transmission signal can be controlled, with the transmission signal being set and held at a desired value decided by the reference voltage $V_{Ref.}$. The transmission signal is then set as a fixed output, stabilized as a radio wave and transmitted from the antenna 140.

In the same way, the gain of the variable gain amplifier 106 is changed according to the transmission output level, so that the input level of the detection circuit 103 is controlled so as to always enable conduction by the detection diode 103a in the detection circuit 103, and accordingly the input level of the detection circuit 103 will always be a level within the range which allows detection by the detection circuit 103, even when the transmission output level is variably controlled over a wide range. Furthermore, the reference voltage $V_{Ref.}$ generated for power control and the differential amplification circuit output voltage $V_{CONT}$ can be controlled so as to fall within a range for which saturation does not occur.

Accordingly, the output level can be varied with high stability and great precision between many fixed levels over a extremely wide dynamic range of transmission output.

For the example input/output characteristics shown in FIG. 4, when the input power is 0 dBm, the reference voltage $V_{Ref.}$ is changed as shown by the voltages in the figure, with at the same time the gain of the variable gain amplifier 106 changing between three levels (0 dB, 30 dB and 60 dB), so that the output power varies between −60 dBm and 28 dBm giving a power control dynamic range of 88 dB, which exceeds the 64 dB dynamic range required by digital cellular portable telephone systems using U.S. CDMA methods (IS-95 standard).

The detection voltage $V_d$ generated by the detection circuit 103 is simultaneously controlled so as to fall within a given range, so that the reference voltage $V_{Ref.}$ can also be controlled so as to fall within a given range (between 0.1V and 3.6V for the example in FIG. 4), so that even when only a low voltage can be achieved by the battery forming the power source, a wide power control dynamic range can be achieved, giving the ideal characteristics for a transmission power control circuit for mobile communication equipment and the like.

It should be noted here that while in the above example, the gain of the variable gain amplifier was given as one of the three levels, 0 dB, 30 dB or 60 dB, with the switching between these levels giving a total dynamic range of 88 dB, the present invention need not be limited to these values, so that the gain switching of the variable gain amplifier can be changed in accordance with the necessary dynamic range.

The following is an explanation of the operation of the sample/hold circuit 107 in the transmission power control circuit 100.

Figure 5:
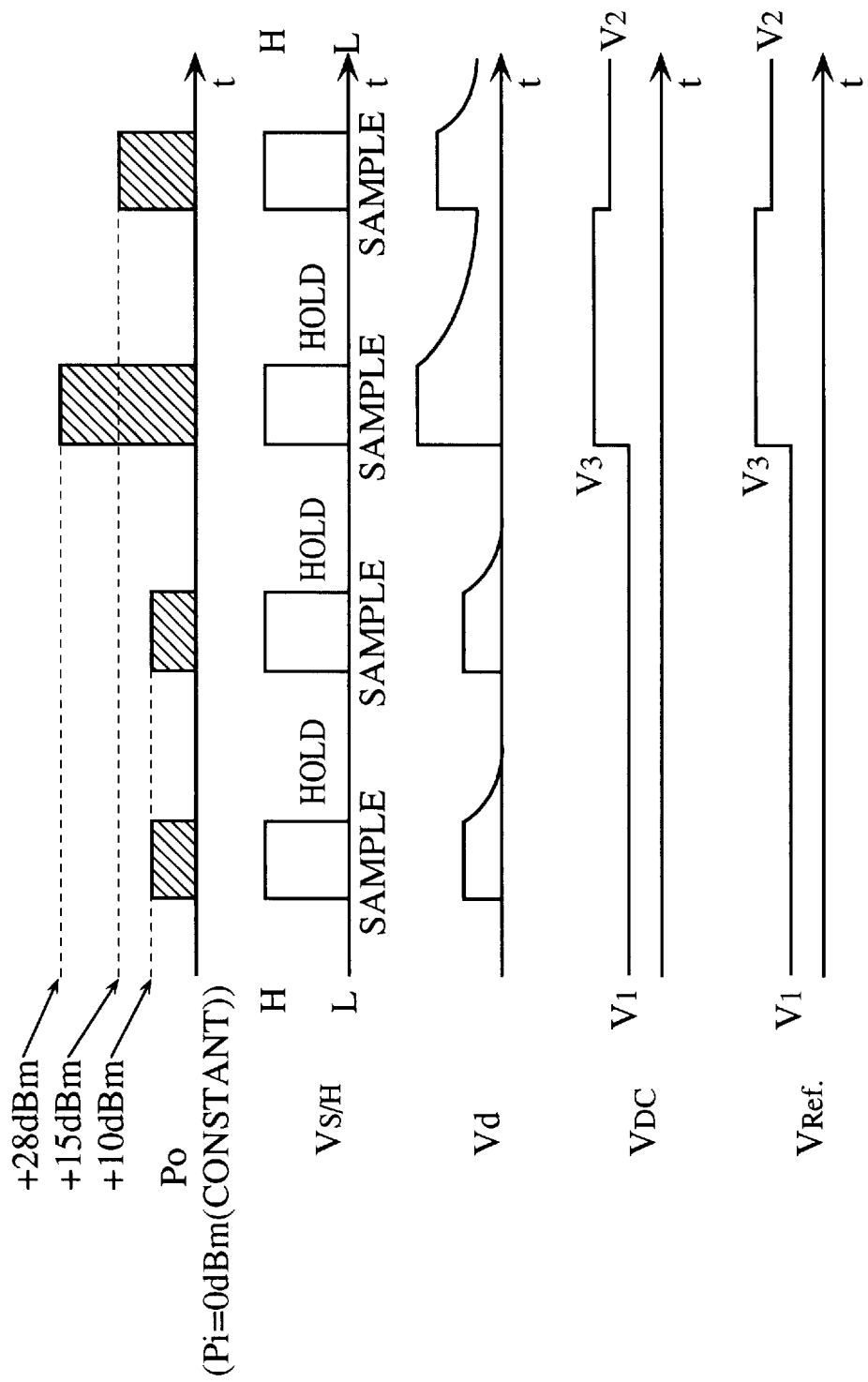
FIG. 5 shows time signal waveforms for showing the power control characteristics in the above embodiment.

FIG. 5 shows all of the time signal waveforms showing the transmission power control characteristics (when the input power is constant at Pi=0 dBm) for when a burst signal under TDMA techniques is transmitted.

When, as described above, the transmission signal is a burst signal, such as that for TDMA techniques, and it is determined from the control signal $V_b$ from the transmission unit 120 that burst is ON, the sample/hold voltage $V_{S/H}$ to be inputted into the sample/hold circuit 107 is set at H level (sampling mode). Conversely, when it is determined that burst is OFF, then the sample/hold voltage $V_{S/H}$ is set at L level (hold mode).

In this way, the sample/hold circuit 107 can automatically repeat its sample/hold operations synchronized to the ON and OFF of the burst transmission signal, so that even if the detection voltage $V_d$ is of a burst waveform, the sample/hold voltage $V_{DC}$ can hold the level of the detection voltage $V_d$ just before the burst switched to OFF, so that ideal power characteristics can be obtained which are unaffected by the ON/OFF states of the burst.

The transmission power output Po can also be switched between the three levels of +10 dBm, +28 dBm and +15 dBm, so that the reference voltage $V_{Ref.}$ can be controlled so as to become one of V1, V2 and V3, and as a result of the feedback control, the sample/hold voltage $V_{DC}$ can be set as one of V1, V2 or V3.

It should be noted here that when, for this embodiment, the transmission signal is a continuous signal, the sample/hold control signal $V_{S/H}$ inputted into the sample/hold circuit 107 from the control circuit 105 will be fixed at H level (sampling mode).

For the case shown in FIG. 5, the transmission output is controlled between 10 dBm and 28 dBm, so that the gain of the variable gain amplifier 106 is fixed at 0 dB, although if the transmission output should be above or below this level, the gain of the variable gain amplifier 106 may be changed accordingly.

By means of the present embodiment described above, the output level can be controlled with high stability and precision between a number of levels covering an extremely wide dynamic range, with the sample/hold circuit 107 being able to be fixed onto sample mode when there is a continuous signal, such as that for analogue portable telephones, so that power control for both continuous signals and burst signals is possible.

Second Embodiment

Figure 6:
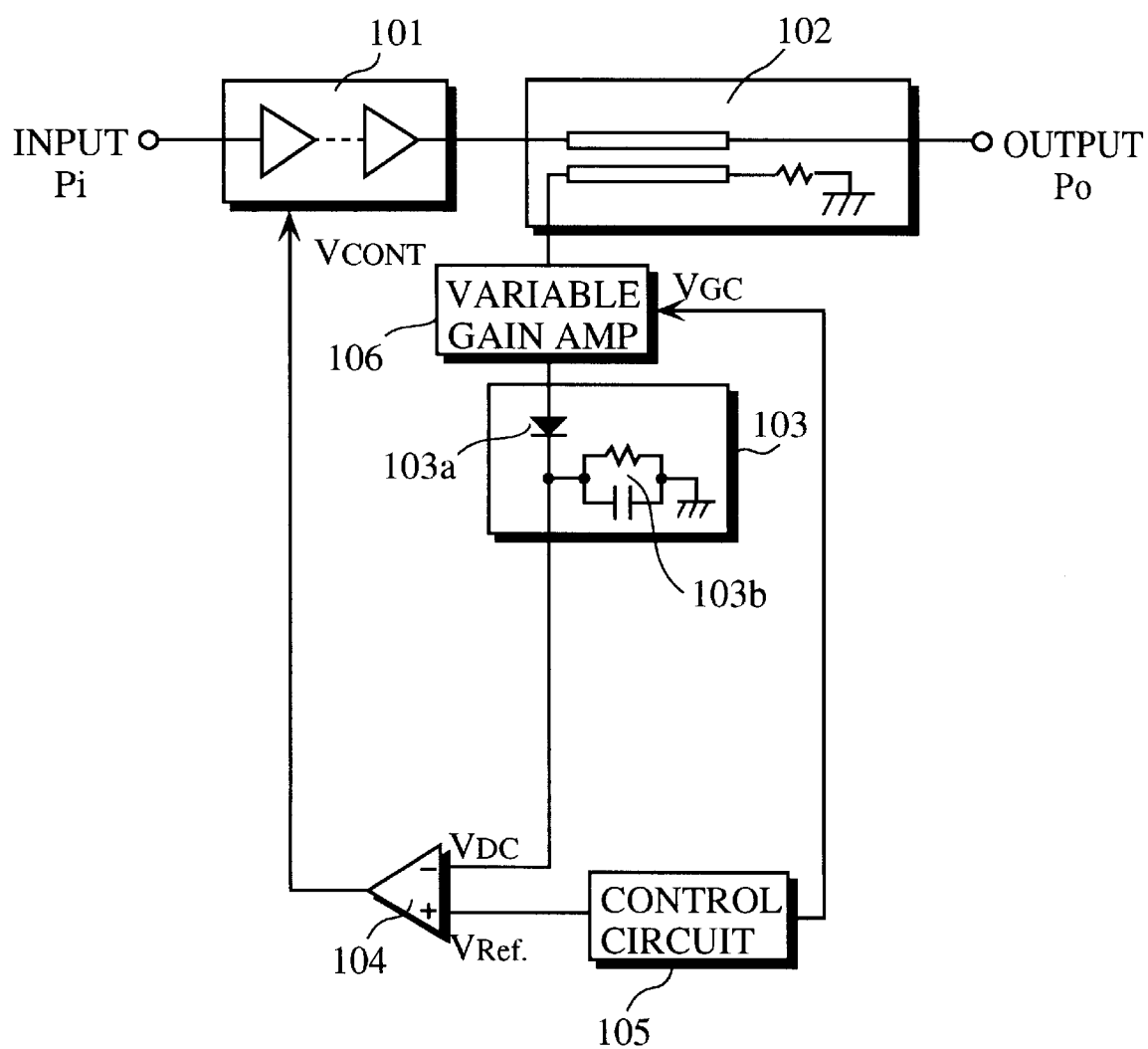
FIG. 6 shows the construction of the second embodiment of the present invention.

FIG. 6 shows the construction of the transmission power control circuit of the second embodiment of the present invention.

It should be noted that in the second and following embodiments, only the transmission power control circuits have been shown, so that the transmission unit 120, the reception unit 130, the reception level monitoring unit 131 and the antenna 140 and the input and output lines from these components which were shown in FIG. 2 have been omitted.

In the same way, components which are given the same reference numerals as those shown in FIG. 2 are the same construction elements as before, so their explanation has been omitted.

The present embodiment differs from the first embodiment, which comprises a sample/hold circuit 107 capable of operating regardless of whether the transmission signal is a burst signal or a continuous signal, in that it can only effect power control when a continuous signal is transmitted.

Accordingly, the construction of the present embodiment differs from the first embodiment in that the sample/hold circuit 107 between the detection circuit output 103 and the differential amplification circuit 104 have been omitted, in that there is no input from the transmission unit 120 into the control circuit 105 relating to the burst signal, and in that there is no control signal $V_{S/H}$.

If, in FIG. 2, the control voltage $V_{S/H}$ inputted into the sample/hold circuit 107 is considered as permanently being for sampling mode, then the operational principles and construction, with the exception of the sample/hold circuit 107, are the same as the first embodiment, so that no further explanation will be given.

Third Embodiment

Figure 7:
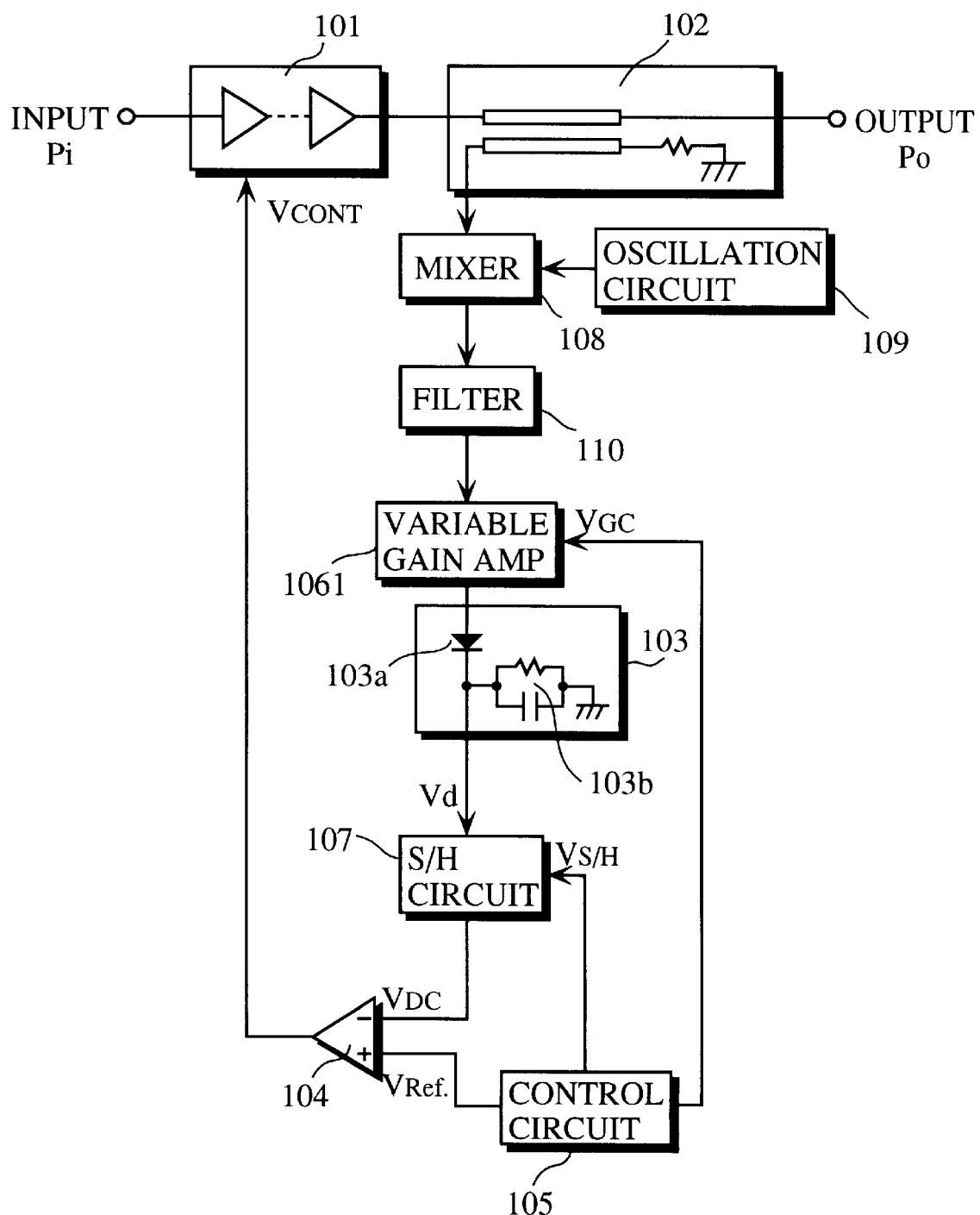
FIG. 7 shows the construction of the third embodiment of the present invention.

FIG. 7 shows the construction of the transmission power control circuit of the third embodiment of the present invention.

The difference with the first embodiment is that instead of being directly inputted into a variable gain amp, the monitoring output from the coupler 102 is first subject to frequency conversion.

In more detail, once the monitoring output of the coupler 102 is inputted into the mixer 108, it is then multiplied by the output of the oscillation circuit 109, so that the monitoring signal output is converted into a low frequency range, such as below 10 MHz (down converted).

After this, the desired signal is obtained via the filter 110 (either a band pass filter or a low pass filter), which is to say, the high frequency component is removed and the envelope curve signal of the low frequency component is obtained and inputted into the low frequency area variable gain amplifier 1061.

In this way, the frequency conversion circuit made up of the mixer 108, the oscillation circuit 109 and the filter 110 performs frequency conversion into a low frequency range (down conversion) for the monitoring output from the coupler 102, so that scale of the circuit is somewhat larger than that of embodiments 1 and 2.

However, there are many cases where the variable gain amplifier 106 for the RF transmission frequency range in the first embodiment will require a relatively expensive component, while in this embodiment, providing a simple frequency conversion circuit for down converting, such as that shown in FIG. 7, gives the advantage of being able to use an OP amplifier of relatively low cost.

With the exception of the provision of a frequency conversion circuit, the construction and control operation are the same as the first embodiment, so that no further explanation will be given.

Fourth Embodiment

Figure 8:
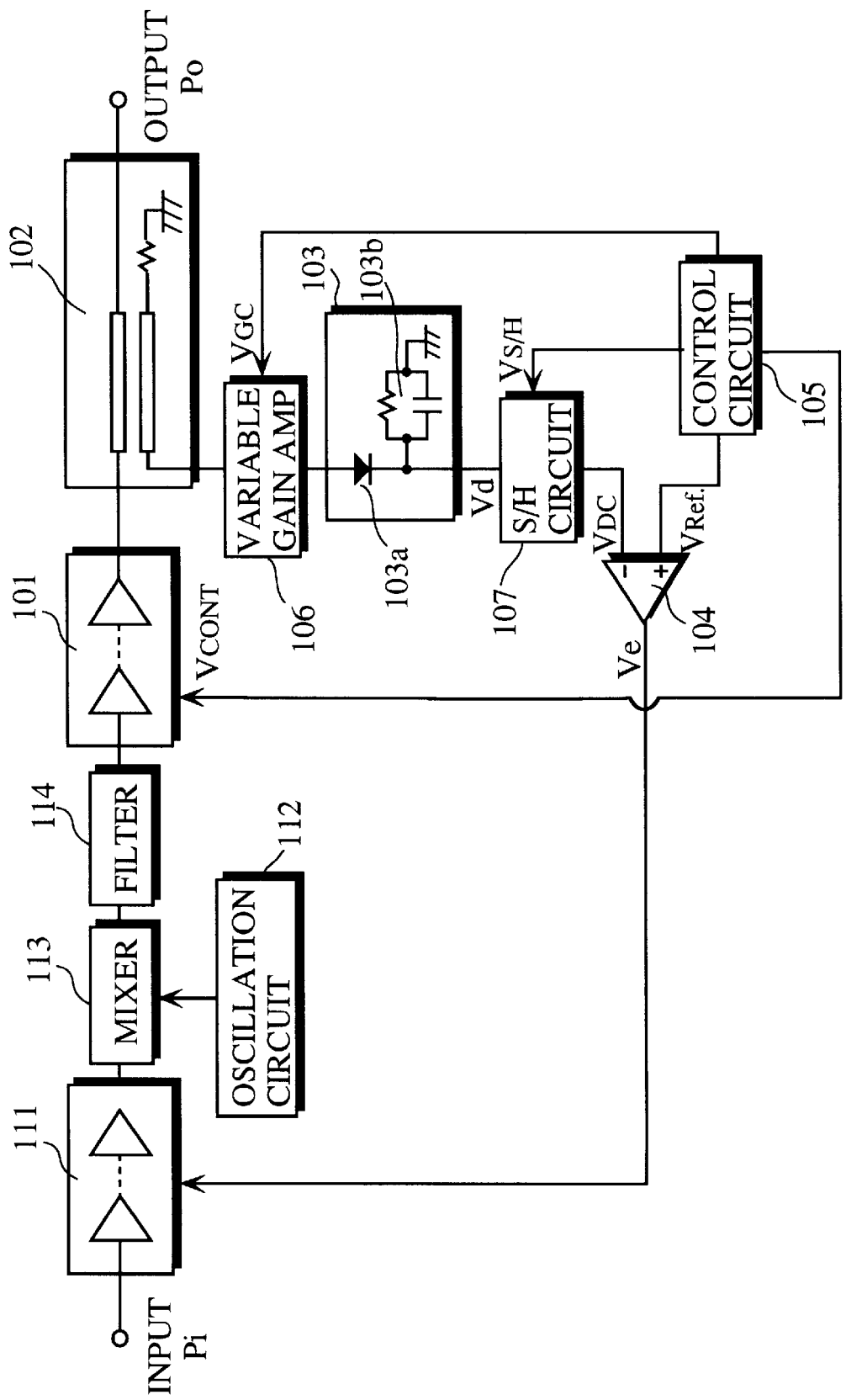
FIG. 8 shows the construction of the fourth embodiment of the present invention.

FIG. 8 shows the construction of the transmission power control circuit of the fourth embodiment of the present invention.

While in embodiments 1 through 3 transmission power is only subject to power control by the power amplifier circuit 101 for the RF transmission frequency range, this fourth embodiment is characterized by the amplifier circuits for power control being split into a power amplifier circuit 101 for the RF frequency range and, positioned before that, an amplifier circuit 111 for the IF frequency range.

That is to say, the output terminal of the differential amplification circuit 104 is connected to the amplifier circuit 111 for the IF frequency range in forming the feedback loop. The output signal from this amplifier circuit 111 is mixed with the output from the oscillation circuit 112 by the mixer 113 and is thereby converted into the RF transmission frequency range (up conversion), with a desired RF frequency range signal being selected by the filter 114. Following this, the signal is inputted into the power amplifier circuit 101 for the RF frequency range, with the control voltage $V_{CONT}$ from the control circuit 105 being applied to this power amplifier circuit 101.

In this way, the output voltage $V_e$ from the differential amplification circuit 104 is applied to the amplifier circuit 111 for the IF frequency range, with the control voltage $V_{CONT}$ from the control circuit 105 being applied to the power amplifier circuit 101 for the RF frequency range.

Accordingly, level stabilizing adjustment of the transmission output is executed by the amplifier circuit 111, and control of the increasing/decreasing of the transmission output is performed by the power amplifier circuit 101.

By dividing the roles within this kind of two-stage amplifier circuit, very precise power control becomes possible.

On the other hand, if the circuit is set up so that the output voltage $V_e$ of the differential amplification circuit 104 is supplied to the power amplifier circuit 101 and the control voltage $V_{CONT}$ from the control circuit 105 is supplied to the amplifier circuit 111, then level stabilizing adjustment of the transmission output may executed by the power amplifier circuit 101, and control of the increasing/decreasing of the transmission output may be performed by the amplifier circuit 111.

By means of the above circuit construction, very precise power control can be realized with a further advantage of reduced cost.

That is to say, since a larger gain can always be achieved by using an IF frequency range amplifier rather than by using an RF frequency range amplifier, even if a same number of amplification components are used, this means the range of gain control can be widened and, since the IF frequency range amplifier can usually be realized at low cost, the cost of the construction can be reduced.

Fifth Embodiment

Figure 9:
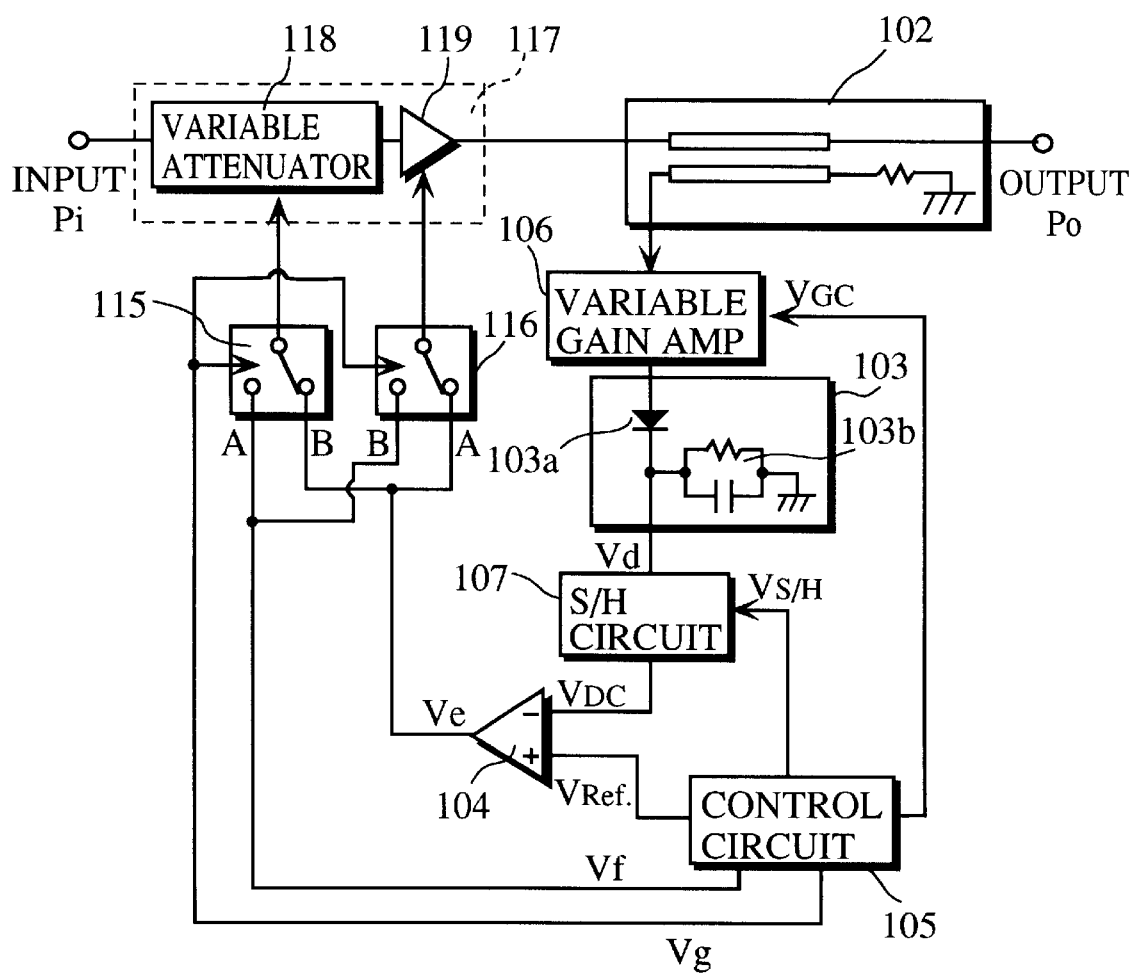
FIG. 9 shows the construction of the fifth embodiment of the present invention.

FIG. 9 shows the construction of the fifth embodiment of the present invention.

In the present embodiment, a circuit construction which can be used for both U.S. analog and digital cellular telephone systems (hereinafter, "dual mode") is shown.

At present in the U.S., there are the two standardized methods listed below for the realization of dual mode cellular phone systems.

(1) Use of an analog FDMA method with a digital TDMA method.

(2) Use of an analog FDMA method with a digital CDMA method.

Here, the analog FDMA (Frequency Division Multiple Access) method is especially referred to as an analog AMPS (Advanced Mobile Phone System) method, with power control in steps of 4 dB over a range of 20 dB being necessary (Mobile equipment classification III).

The digital TDMA method similarly requires power control in steps of 4 dB over a range of 20 dB (Mobile equipment classification III).

On the other hand, the digital CDMA method requires power control in steps of 1 dB over a range of at least 64 dB (Mobile equipment classification III).

In FIG. 9, the power amplifier circuit 117 is constructed of a variable attenuator 118 which can vary its attenuation factor according to an applied voltage, which is followed in the circuit by a variable power amplifier 119 which, in the same way, can vary its amplification factor according to an applied voltage.

The output terminal of the differential amplification circuit 104 is branched and is connected to both the B terminal of switch 115 and the A terminal of switch 116, with the terminal of the control circuit 105 which outputs the control signal $V_f$ being branched and connected to both the A terminal of switch 115 and the B terminal of switch 116.

Furthermore, the switched output of the switch 115 is set as the control voltage input for controlling the attenuation factor of the variable attenuator 118 in the power amplifier circuit 117, with the switched output of the switch 116 being set as the control voltage input for controlling the amplification factor of the power amplifier 119 in the power amplifier circuit 117.

As a result, the control point of the feedback loop of the transmission power control circuit can be switched between the variable attenuator 118 and the power amplifier 119, these being selected by the switch 115 and the switch 116, respectively.

Here, the switching control signal $V_g$ for the switch 115 and the switch 116 is generated by the control circuit 105, for example, by a manual input of a desired transmission mode into the control circuit 105.

The following is an explanation of the operation of the present embodiment, constructed as described above, during dual mode (1) mentioned above.

Under dual mode (1), although the step width and power control range are the same for both analog mode and digital mode, the analog method uses FM modulation while the digital method uses π/4 shift QPSK modulation, so that since the digital method uses linear modulation, distortion characteristics are attached great importance, while, since such distortion characteristics are not such a problem for analog methods, efficiency becomes the main object for analog methods.

As a result, for transmission mode under the analog method (hereinafter, "analog mode"), the switch 115 and the switch 116 are switched to the A side by means of the switching control signal $V_g$ from the control circuit 105.

At this point, the control voltage $V_f$ (a constant value) generated by the control circuit 105 is inputted into the variable attenuator 118 via the switch 115, so that attenuation factor of the variable attenuator 118 is set its lowest value.

Power control over a 20 dB range in steps of 4 dB is then achieved by changing the reference voltage $V_{Ref.}$ given by the control circuit 105 in steps so as to change the control voltage $V_e$ supplied to the power amplifier 119.

On the other hand, in digital mode, the switch 115 and the switch 116 are switched to the B side by means of the switching control signal $V_g$ from the control circuit 105.

In this mode, transmission power control is achieved by adjusting the attenuation factor of the variable attenuator 118, which changes the input power of the power amplifier 119 and thereby sets the input level with the lowest signal distortion characteristics for the amplification by the power amplifier 119.

In order to do so, the reference voltage $V_{Ref.}$ is set by the control circuit 105 so that the input level into the power amplifier 119 is in the range which gives the lowest signal distortion characteristics as described above and so that the desired transmission output can be achieved. The control voltage $V_e$ is outputted by the differential amplification circuit 104 based on this reference voltage $V_{Ref.}$ and is supplied to the variable attenuator 118 via the switch 115.

On the other hand, the control voltage $V_f$ is generated by the control circuit 105 as the bias voltage for the power amplifier 119 so that its operation is set as A level or AB level which have superior linear characteristics for low distortion generation, with this control voltage $V_f$ being supplied to the power amplifier 119 via the switch 116.

In this way, under digital mode the adjustment of transmission output with low distortion is achieved.

It should be noted that in analog mode, since the transmission signal is a continuous signal, the sample/hold circuit 107 always performs a sampling operation so that the output of the detection circuit 103 is supplied as it is to the inverse input terminal of the differential amplification circuit 104.

On the other hand, in digital mode the sample/hold circuit 107 automatically changes between sample and hold operations, as described above, in accordance with the burst ON and OFF of the TDMA transmission signal.

Also, for the dual mode (1) described above, since a dynamic range of only 0 dB to 20 dB is required, the gain of the variable gain amplifier 106 can be set a constant value (for example, 0 dB) for both analog and digital modes.

The following is an explanation of the operation of the present embodiment during dual mode (2).

The operation under analog mode is the same as that for dual mode (1), so no further explanation will be given.

In digital mode, the switch 115 and the switch 116 are switched to their B sides in the same way as in dual mode (1), but for CDMA methods, a dynamic range of at least 64 dB is necessary, so that the operation of the control circuit 105 is somewhat different.

More specifically, the control voltage $V_f$ is generated by the control circuit 105 as the bias voltage for the power amplifier 119 so that the operation of the power amplifier 119 is set at A level or AB level which have superior linear characteristics for low distortion generation. This control voltage $V_f$ is supplied to the power amplifier 119 via the switch 116.

Transmission power control is executed by adjusting the attenuation factor of the variable attenuator 118, and in order to extend the dynamic range of power control, the reference voltage $V_{Ref.}$ is set so as change the attenuation factor over a greater range than was the case in the dual mode (1).

Even in this case, while it is desireable to change the attenuation factor of the variable attenuator 118 so that for the amplification of the power amplifier 119, the input level is set as much as possible within the range for low signal distortion characteristics, there are occasions when this demand is somewhat downplayed in order to extend the dynamic range.

However, even in such case, since the power amplifier 119 is controlled by the control voltage $V_f$ from the control circuit 105 so that its operating point is in the linear range, this kind of predicament can be sufficiently compensated.

It should be noted here that in accordance with the increase in the dynamic range of the transmission output level, increase/decrease in the gain of the variable gain amplifier 106 is controlled so that the monitoring output of the coupler 102 is set at a level within the range for which detection is possible by the detection circuit 103, with this control operation being described in the first embodiment.

In the present embodiment described above, by means of the switching of switches 115, 116 and the setting of an appropriate value for the control voltage and reference voltage from the control circuit 105, a transmission power control circuit for using any of analog FDMA (analog AMPS), digital TDMA and digital CDMA can be achieved.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A device for controlling radio output a device for controlling radio output of a mobile terminal, comprising:

transmission signal amplification means for amplifying an inputted transmission signal by an amplification factor decided by an applied first control signal;

monitoring means for monitoring the transmission signal amplified by the transmission signal amplification means;

monitoring signal amplification means for amplifying an output of the monitoring means by an amplification factor decided by an applied second control signal;

detection means for detecting an output signal from the monitoring signal amplification means;

differential amplification means for comparing a signal outputted by the detection means and a supplied reference signal and amplifying a difference between the two signals so as to generate the first control signal; and control means for generating the second control signal and the reference signal;

wherein the control means decides the amplification factor of the monitoring signal amplification means so that a level of the output of the monitoring means is within a range which allows detection by the detection means; and wherein the transmission signal amplification means includes:

attenuation means whose attenuation factor varies according to an applied control signal; and third amplification means, disposed after the attenuation means, whose amplification factor varies according to an applied control signal, and the device for controlling radio output further includes switching means which, for the first control signal from the differential amplification means and a fourth control signal from the control means, switches between a first connection pattern in which the fourth control signal is applied to the attenuation means and the first control signal is applied to the third amplification means and a second connection pattern in which the first control signal is applied to the attenuation means and the fourth control signal is applied to the third amplification means.

2. The device for controlling radio output of claim 1, wherein the switching means is switched by means of an indication from the control means to the first connection pattern when the transmission signal is an analog signal and to the second connection pattern when the transmission signal is a digital signal.

3. The device for controlling radio output of claim 2, wherein in the first connection pattern, the fourth control signal is set by the control means so that the attenuation factor of the attenuation means is a lowest value.

4. The device for controlling radio output of claim 3, wherein in the second connection pattern, the fourth control signal is set by the control means so that an operating point of the third amplification means is in a linear range.

5. The device for controlling radio output of claim 4, further comprising sample/hold means, disposed between the detection means and the differential amplification means, which, according to an indication from the control means, samples or holds the signal outputted by the detection means, and then supplies the sampled or held signal outputted by the detection means to the differential amplification means.

6. The device for controlling radio output of claim 5, wherein the transmission signal is a signal transmitted in burst format, and the control means executes control so that when burst is ON for the transmission signal, the sample/hold means samples the output of the monitoring means, while when burst is OFF for the transmission signal, the sample/hold means holds the output of the monitoring means just before burst is OFF.

7. A device for controlling radio output of a mobile terminal, comprising:
  a transmission output amplifier for amplifying a signal to be transmitted, with an amplification factor decided by a first control signal;
  monitoring means, disposed on an output side of the transmission output amplifier, for monitoring power of a transmission output;
  a variable gain amplifier for amplifying the monitored transmission output, with an amplification factor being decided by a second control signal;
  detection means, with a diode as a main component, for detecting an output signal from the variable gain amplifier;
  differential amplification means for comparing an output of the detection means and a reference signal and amplifying a difference between the two signals so as to generate the first control signal; and
  control means for generating the second control signal and the reference signal,
  wherein the second control signal is adjusted to become a value for setting a gain of the variable gain amplifier so that a level of an output of the monitoring means falls within a range for which detection by the detection means is possible, and the reference signal is adjusted as a function of the second control signal;
  wherein the transmission signal amplification means is constructed of first amplification means and second amplification means which are arranged in series and which have their respective amplification ratios varied by means of applied control signals, with the first control signal being applied to the first amplification means and a third control signal from the control means being applied to the second amplification means;
  wherein the first amplification means is amplification means for amplifying a signal in an IF frequency range, while the second amplification means is amplification means for amplifying a signal in an RF frequency range, and the device for controlling radio output further comprises frequency conversion means disposed between the first amplification means and the second amplification means, for converting the signal in the IF frequency range to a signal in the RF frequency range.

8. The device for controlling radio output of claim 7, wherein the reference signal and the second control signal are adjusted inter-relatedly so as to reduce the gain of the variable gain amplifier when the radio output has been increased.

9. A device for controlling radio output of a mobile terminal, comprising:
  transmission signal amplification means for amplifying an inputted transmission signal by an amplification factor decided by an applied first control signal;
  monitoring means for monitoring the transmission signal amplified by the transmission signal amplification means;
  monitoring signal amplification means for amplifying an output of the monitoring means by an amplification factor decided by an applied second control signal;
  detection means for detecting an output signal from the monitoring signal amplification means;
  differential amplification means for comparing a signal outputted by the detection means and a supplied reference signal and amplifying a difference between the two signals so as to generate the first control signal; and
  control means for generating the second control signal and the reference signal;
  wherein the control means decides the amplification factor of the monitoring signal amplification means so that a level of the output of the monitoring means is within a range which allows detection by the detection means;
  wherein the transmission signal amplification means is constructed of first amplification means and second amplification means which are arranged in series and which can have their respective amplification ratios varied by means of applied control signals, with the first control signal being applied to the first amplification means and a third control signal from the control means being applied to the second amplification means; and
  wherein the first amplification means is amplification means for amplifying a signal in an IF frequency range, while the second amplification means is amplification means for amplifying a signal in an RF frequency range, and the device for controlling radio output further comprises frequency conversion means, disposed between the first amplification means and the second amplification means, for converting the signal in the IF frequency range to a signal in the RF frequency range.

10. The device for controlling radio output of claim 9, wherein the control means generates the second control signal for controlling in steps the amplification factor of the monitoring signal amplification means.

11. The device for controlling radio output of claim 9, further comprising first frequency conversion means, disposed between the monitoring means and the monitoring signal amplification means, for frequency converting the output of the monitoring means to a frequency lower than the output of the monitoring means and sending a converted output to the monitoring signal amplification means.

12. The device for controlling radio output of claim 11, further comprising sample/hold means, disposed between the detection means and the differential amplification means, which, according to an indication from the control means, samples or holds the signal outputted by the detection means, and then supplies the sampled or held signal outputted by the detection means to the differential amplification means.

13. The device for controlling radio output of claim 12, wherein the transmission signal is a signal transmitted in burst format, and the control means executes control so that when burst is ON for the transmission signal, the sample/hold means samples the output of the monitoring means, while when burst is OFF for the transmission signal, the sample/hold means holds the output of the monitoring means just before burst is OFF.

14. The device for controlling radio output of claim 9, further comprising sample/hold means, disposed between the detection means and the differential amplification means, which, according to an indication from the control means, samples or holds the signal outputted by the detection means, and then supplies the sampled or held signal outputted by the detection means to the differential amplification means.

15. The device for controlling radio output of claim 14, wherein the transmission signal is a signal transmitted in burst format, and the control means executes control so that when burst is ON for the transmission signal, the sample/hold means samples the output of the monitoring means, while when burst is OFF for the transmission signal, the sample/hold means holds the output of the monitoring means just before burst is OFF.

16. The device for controlling radio output of claim 9, wherein the control means controls the reference signal and the second control signal as a function of a monitored reception level.

17. The device for controlling radio output of claim 16, further comprising a reception level monitoring means outputting a reception monitoring voltage as a function of the monitored reception level of a signal received by a reception unit.

18. The device for controlling radio output of claim 8, wherein the control means changes the third control signal so that a transmission output level is set in accordance with a reception monitoring voltage.

* * * * *